(12) United States Patent
Tsukamoto et al.

(10) Patent No.: US 10,382,006 B2
(45) Date of Patent: Aug. 13, 2019

(54) VARIABLE FREQUENCY FILTER, RADIO FREQUENCY FRONT-END CIRCUIT, AND COMMUNICATION TERMINAL

(71) Applicant: Murata Manufacturing Co., Ltd., Kyoto (JP)

(72) Inventors: Hideki Tsukamoto, Kyoto (JP); Masakazu Tani, Kyoto (JP); Kei Matsutani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/145,438

(22) Filed: Sep. 28, 2018

(65) Prior Publication Data

US 2019/0036508 A1 Jan. 31, 2019

Related U.S. Application Data (63) Continuation of application No. PCT/JP2017/011573, filed on Mar. 23, 2017.

(30) Foreign Application Priority Data

Mar. 31, 2016 (JP) .................................. 2016-070032

(51) Int. Cl.
*H04B 1/38* (2015.01)
*H03H 7/46* (2006.01)
(Continued)

(52) U.S. Cl.
CPC .............. *H03H 7/465* (2013.01); *H03F 3/19* (2013.01); *H03H 7/075* (2013.01); *H03H 7/24* (2013.01);
(Continued)

(58) Field of Classification Search
CPC ...... H03H 9/6483; H03H 9/605; H03H 9/568; H03H 7/0115; H03H 7/075;
(Continued)

(56) References Cited

U.S. PATENT DOCUMENTS 6,472,953 B1   10/2002  Sakuragawa et al.
2009/0251235 A1  10/2009  Belot et al.
(Continued)

FOREIGN PATENT DOCUMENTS

JP   H0-334463 A    2/1991
JP   2000-323961 A  11/2000
(Continued)

OTHER PUBLICATIONS

International Search Report for International Application No. PCT/JP2017/011573 dated Jun. 6, 2017.
(Continued)

*Primary Examiner* — Nhan T Le
(74) *Attorney, Agent, or Firm* — Pearne & Gordon LLP (57) ABSTRACT

A first attenuation circuit is connected between a node and ground, and the node is located between a ladder resonance circuit and a transmitter-side terminal. A second attenuation circuit is connected between a first parallel arm resonator of the ladder resonance circuit and ground and is connected in series to the first parallel arm resonator. The first attenuation circuit includes a second parallel arm resonator and a first switch that switches between a first state in which the second parallel arm resonator is connected to the node and a second state in which the first switch is open. The second attenuation circuit includes a capacitor and a second switch that switches between a first state in which the capacitor is connected to the first parallel arm resonator and a second state in which the first parallel arm resonator is connected to ground.

13 Claims, 5 Drawing Sheets

(51) Int. Cl.
*H03H 7/075* (2006.01)
*H03F 3/19* (2006.01)
*H03H 7/24* (2006.01)
*H03H 7/38* (2006.01)
*H03H 9/54* (2006.01)
*H04B 1/04* (2006.01)
*H04B 1/10* (2006.01)
*H03H 9/56* (2006.01)
*H03H 9/60* (2006.01)
*H03H 9/64* (2006.01)

(52) U.S. Cl.
CPC .............. *H03H 7/38* (2013.01); *H03H 7/461* (2013.01); *H03H 9/54* (2013.01); *H03H 9/542* (2013.01); *H03H 9/568* (2013.01); *H03H 9/605* (2013.01); *H03H 9/6436* (2013.01); *H03H 9/6483* (2013.01); *H04B 1/0475* (2013.01); *H04B 1/1018* (2013.01); *H03F 2200/451* (2013.01); *H03H 2210/012* (2013.01); *H03H 2210/036* (2013.01)

(58) Field of Classification Search
CPC .... H03H 2210/025; H03H 9/205; H03H 7/38; H03H 9/54; H03H 9/6433; H03H 7/461; H03H 9/46; H03H 9/545; H03H 7/24; H03H 7/465; H03H 9/547; H03F 3/19; H03F 3/195; H03F 3/245
See application file for complete search history.

(56) References Cited

U.S. PATENT DOCUMENTS

| 2016/0380615 | A1* | 12/2016 | Endo ...................... H03H 9/725 333/133 |
| 2018/0198437 | A1* | 7/2018 | Mori ........................ H04B 1/52 |
| 2018/0367122 | A1* | 12/2018 | Kawasaki .......... H03H 9/14552 |
| 2019/0089329 | A1* | 3/2019 | Konaka .................... H03H 9/25 |

FOREIGN PATENT DOCUMENTS

| JP | 2008-301223 A | 12/2008 |
| JP | 2009-165066 A | 7/2009 |
| JP | 2013-239839 A | 11/2013 |

OTHER PUBLICATIONS

Written Opinion for International Application No. PCT/JP2017/011573 dated Jun. 6, 2017.

\* cited by examiner

VARIABLE FREQUENCY FILTER, RADIO FREQUENCY FRONT-END CIRCUIT, AND COMMUNICATION TERMINAL

This is a continuation of International Application No. PCT/JP2017/011573 filed on Mar. 23, 2017 which claims priority from Japanese Patent Application No. 2016-070032 filed on Mar. 31, 2016. The contents of these applications are incorporated herein by reference in their entireties.

BACKGROUND

Technical Field

The present disclosure relates to a variable frequency filter whose frequency characteristics are adjustable, a radio frequency (RF) front-end circuit equipped with this variable frequency filter, and a communication terminal.

Acoustic wave filters, which use acoustic waves, are widely used in the related art for bandpass filters or the like disposed in the front-end portion of a mobile communication apparatus. Radio frequency front-end circuits equipped with a plurality of acoustic wave filters have been put into practical use to cope with multi-purpose applications involving multiple modes, multiple bands, or the like.

For example, there is a configuration of an acoustic wave filter to manage multiple bands known in the art. In this configuration, a capacitor and a switch connected in parallel are connected in series to a parallel arm resonator in a ladder filter constituted by bulk acoustic wave (BAW) resonators (for example, refer to Patent Document 1). Such acoustic wave filters form two attenuation poles having different frequencies on the lower-frequency side of a passband (lower-frequency side outside a passband) in accordance with the switching between the on (closed) state and the off (open) state of a switch and constitute a tunable filter (variable frequency filter) capable of varying a passband.

Patent Document 1: U.S. Patent Application Publication No. 2009/0251235

BRIEF SUMMARY

In the case of Patent Document 1 mentioned above, the two attenuation poles on the lower-frequency side of the passband are formed by capacitors. In such a case, the second attenuation pole, which is located at the higher frequency on the lower-frequency side of the passband, has a steep slope, but the first attenuation pole, which is located at the lower frequency on the lower-frequency side of the passband, has only a small amount of attenuation.

This results in a small amount of attenuation at the attenuation pole at the lower frequency, and it is difficult to obtain a wide bandwidth for a stopband and a large amount of attenuation on the lower-frequency side of the passband of a variable frequency filter.

Consequently, such a variable frequency filter is not capable of handling a situation in which a band for the 3rd Generation Partnership Project (3GPP), a band for digital television, a band for Wireless Fidelity (Wi-Fi), and the like are closely aligned on the lower-frequency side of the passband of the variable frequency filter. Examples of such bands include BAND28B and the band corresponding to NS17 to protect a band for digital television.

Thus, the present disclosure provides a small variable frequency filter that has a sufficient amount of attenuation. The small variable frequency filter is capable of increasing the amount of attenuation at the first attenuation pole, which is located at the lower frequency on the lower-frequency side of the passband while maintaining the steep slope at the second attenuation pole, which is located at the higher frequency on the lower-frequency side of the passband. The present disclosure further provides an RF front-end circuit equipped with this variable frequency filter, a communication terminal, and a method of setting the variable frequency filter.

A variable frequency filter according to the present disclosure includes a ladder resonance circuit, a first attenuation circuit, and a second attenuation circuit. The ladder resonance circuit includes a series arm circuit connected between an antenna-side terminal and a transmitter-side terminal and a parallel arm circuit that is connected between a node and ground and that includes at least one parallel arm resonator. The node is located on a path connecting the antenna-side terminal and the transmitter-side terminal. The first attenuation circuit is connected between a node and ground, and the node is located between the ladder resonance circuit and the transmitter-side terminal. The second attenuation circuit is connected between at least one first parallel arm resonator among the at least one parallel arm resonator in the parallel arm circuit and ground and is connected in series to the first parallel arm resonator. The first attenuation circuit includes a second parallel arm resonator and a first switch that switches between a first state in which the second parallel arm resonator is connected to the node and a second state in which the first switch is open. The second attenuation circuit includes a capacitor and a second switch that switches between a first state in which the capacitor is connected to the first parallel arm resonator and a second state in which the first parallel arm resonator is connected to ground. The second switch is in the first state when the first switch is in the first state.

This configuration improves an attenuation characteristic on the lower-frequency side of a filter characteristic selected in the first state.

The second switch is in the second state when the first switch is in the second state in the variable frequency filter according to the present disclosure.

This configuration realizes a filter characteristic according to the second state, and the filter characteristic according to the second state differs from a filter characteristic according to the first state.

In the variable frequency filter according to the present disclosure, two or more of the at least one parallel arm resonator can be included.

This configuration can easily realize a desired filter characteristic.

In the variable frequency filter according to the present disclosure, the second parallel arm resonator can form the first attenuation pole, and the first parallel arm resonator and the capacitor can form the second attenuation pole. The frequency of the second attenuation pole can be closer than the frequency of the first attenuation pole to the communication frequency band realized in the first state.

This configuration can provide a sufficient amount of attenuation on the lower-frequency side in the first state.

In the variable frequency filter according to the present disclosure, the ladder resonance circuit can further include an inductor connected to a terminal of the ladder resonance circuit, the terminal being on the side of the transmitter-side terminal.

This configuration realizes both a filter characteristic according to the first state and a filter characteristic according to the second state with a higher degree of certainty.

In the variable frequency filter according to the present disclosure, the inductor can be connected in series to the ladder resonance circuit.

In this configuration, the width of the passband in the first state and the width of the passband in the second state are adjusted.

In the variable frequency filter according to the present disclosure, the inductor can extend the resonance frequency of the ladder resonance circuit so that the passband of the variable frequency filter covers the communication frequency band of the communication band to which the first state is applied and the communication frequency band of the communication band to which the second state is applied.

This configuration realizes with a higher degree of certainty a bandpass characteristic of a filter for the communication band to which the first state is applied and a bandpass characteristic of a filter for the communication band to which the second state is applied.

In the variable frequency filter according to the present disclosure, the passband of the variable frequency filter can be extended to a frequency between the frequency band of the spurious emission regulations NS17 and the frequency band of the spurious emission regulations NS18.

This configuration is capable of satisfying the spurious emission regulations NS18 and the spurious emission regulations NS17 individually.

In the variable frequency filter according to the present disclosure, the ladder resonance circuit may be connected to a longitudinally coupled resonator filter, and the first attenuation circuit may be connected to a connecting node between the longitudinally coupled resonator filter and the transmitter-side terminal.

This configuration can also realize filter characteristics that differ in the first state and in the second state. Passbands of the filter characteristics in the first state and in the second state partially overlap with each other.

An RF front-end circuit according to the present disclosure includes the variable frequency filter described above as a transmitter-side filter. The RF front-end circuit further includes a transmitter-side amplifier circuit connected to the transmitter-side filter.

In this configuration, when communication is provided in the communication band to which the first state is applied and an unnecessary wave component in a transmit signal amplified by the transmitter-side amplifier circuit is present in the frequency band of the communication band to which the second state is applied, the unnecessary wave component is considerably reduced.

The RF front-end circuit according to the present disclosure may further include a receiver-side filter that performs filtering processing in which a receive signal of the communication band to which the first state is applied and a receive signal of the communication band to which the second state is applied are processed, and the transmitter-side filter and the receiver-side filter may constitute a demultiplexer.

This configuration prevents an unnecessary wave component in a transmit signal of each of the communication bands from being transmitted to outside, and a receive signal of each of the communication bands is subjected to proper filtering processing. In addition, this configuration realizes miniaturization of a demultiplexer.

A communication terminal according to the present disclosure includes the RF front-end circuit, a receiver-side amplifier circuit, and an RF integrated circuit (RFIC). The receiver-side amplifier circuit is connected to the receiver-side filter. The RFIC is connected to the transmitter-side amplifier circuit and the receiver-side amplifier circuit.

This configuration prevents an unnecessary wave component in a transmit signal of each of the communication bands from being transmitted to outside, and a receive signal of each of the communication bands is subjected to proper filtering processing. In addition, this configuration realizes miniaturization of a communication terminal.

In the communication terminal according to the present disclosure, the RFIC can control the first attenuation circuit and the second attenuation circuit and can perform switching control of the first switch and the second switch in accordance with communication band information obtained from outside.

This configuration can realize a proper filtering processing in accordance with the communication band information.

According to the present disclosure, the amount of attenuation at the first attenuation pole, which is located at the lower frequency on the lower-frequency side of a passband, can be increased while a steep slope at the second attenuation pole, which is located at the higher frequency on the lower-frequency side of the passband, is maintained.

DETAILED DESCRIPTION

Figure 1:
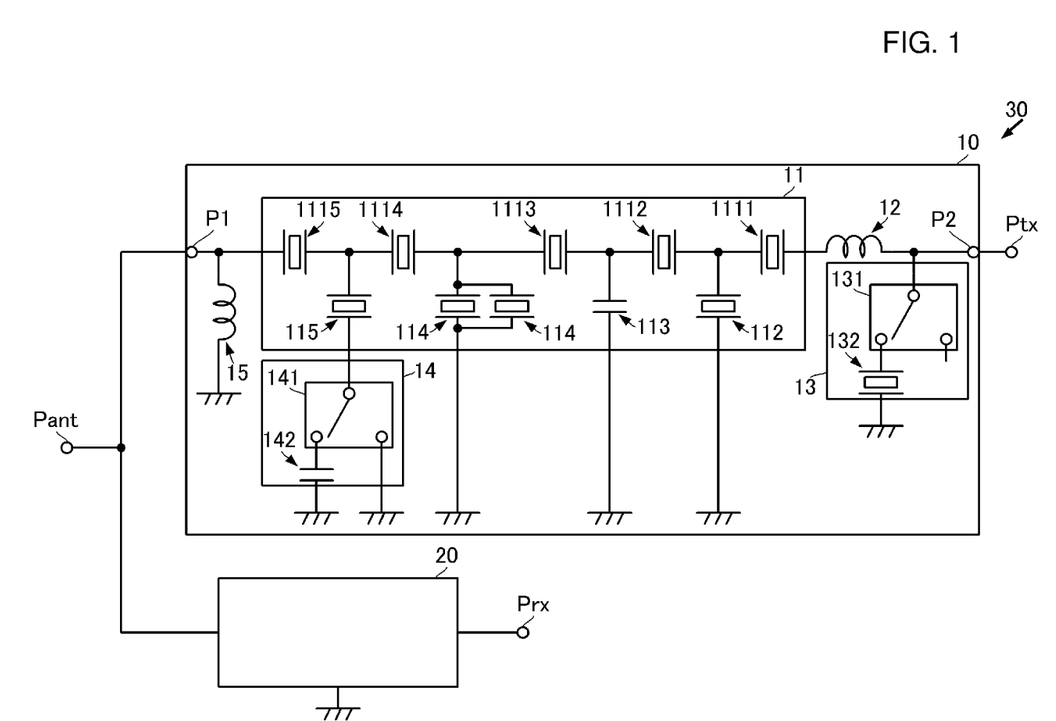
FIG. 1 is a circuit diagram of a demultiplexer equipped with a variable frequency filter according to an embodiment of the present disclosure.

A variable frequency filter, an RF front-end circuit, a communication terminal, and a method of setting the variable frequency filter according to an embodiment of the present disclosure will be described with reference to the drawings. FIG. 1 is a circuit diagram of a demultiplexer equipped with the variable frequency filter according to the embodiment of the present disclosure.

As depicted in FIG. 1, a demultiplexer 30 includes a variable frequency filter 10, which is a transmitter-side filter circuit, and a receiver-side filter circuit 20. The demultiplexer 30 corresponds to an "RF front-end circuit" according to the present disclosure. An antenna-side terminal P1 of the variable frequency filter 10 and one end of the receiver-side filter circuit 20 are connected to an antenna terminal Pant. A transmitter-side terminal P2 of the variable frequency filter 10 is connected to a transmitter-side terminal Ptx. The other end of the receiver-side filter circuit 20 is connected to a receiver-side terminal Prx.

The variable frequency filter 10, which is the transmitter-side filter circuit, performs filtering processing in the transmit frequency band of the first communication band and in the transmit frequency band of the second communication band. The frequency bands of the two communication bands partially overlap with each other. The receiver-side filter circuit 20 performs filtering processing in the receive frequency band of the first communication band and in the receive frequency band of the second communication band.

In a specific example, the first communication band is a communication band BAND28A according to the 3GPP2 standard, and the second communication band is another communication band BAND28B according to the 3GPP2 standard. In the 3GPP2 standard, a communication band BAND28 is constituted by the communication band BAND28A and the communication band BAND28B.

The transmit frequency band of the communication band BAND28A ranges from 703 [MHz] to 733 [MHz], and the transmit frequency band of the communication band BAND28B ranges from 718 [MHz] to 748 [MHz]. The transmit frequency band of the communication band BAND28 ranges from 703 [MHz] to 748 [MHz]. The receive frequency band of the communication band BAND28A ranges from 758 [MHz] to 788 [MHz], and the receive frequency band of the communication band BAND28B ranges from 773 [MHz] to 803 [MHz]. The receive frequency band of the communication band BAND28 ranges from 758 [MHz] to 803 [MHz].

Such division of the communication band is necessary because the transmit frequency band of the communication band BAND28 overlaps a broadcasting frequency band for digital television broadcasting (DTV) and is subject to spurious emission regulations. Specifically, the communication band BAND28A is subject to the "NS17" spurious emission regulations in 3GGP2 and is not allowed to be used in a broadcasting area where DTV signals to which these regulations are applied are used. Thus, the communication band BAND28B is specified for communication in such a broadcasting area. In such a case, a communication terminal is required to not only pass transmit signals in the communication band BAND28B with a low loss, but also satisfy the "NS17" spurious emission regulations set for the frequency band of the communication band BAND28A.

On the other hand, in an area other than such a broadcasting area, the communication band BAND28A is allowed to be used. That is, the entire frequency band of the communication band BAND28 is allowed to be used.

The configuration according to the present disclosure is effective, as in the case described above, when a plurality of communication bands whose passbands are closely aligned or partially overlap with each other are switched for use.

The variable frequency filter 10 includes the antenna-side terminal P1, the transmitter-side terminal P2, a ladder resonance circuit 11, inductors 12 and 15, a first attenuation circuit 13, and a second attenuation circuit 14. The inductor 12 corresponds to an "inductor for extension" according to the present disclosure.

The antenna-side terminal P1 is connected to one end of the ladder resonance circuit 11, the other end of the ladder resonance circuit 11 is connected to the first terminal of the inductor 12, and the second terminal of the inductor 12 is connected to the transmitter-side terminal P2.

The ladder resonance circuit 11 includes a plurality of series arm resonators 1111, 1112, 1113, 1114, and 1115, a plurality of parallel arm resonators 112, 114, and 115, and a parallel arm capacitor 113. Two parallel arm resonators 114 are disposed, and the two parallel arm resonators 114 are connected in parallel. The capacitance of the parallel arm capacitor 113 is fixed.

The plurality of series arm resonators 1111, 1112, 1113, 1114, and 1115 are connected in series in this order from the side of the transmitter-side terminal Ptx toward the side of the antenna terminal Pant.

One end of the parallel arm resonator 112 is connected to a line connecting the series arm resonator 1111 and the series arm resonator 1112, and the other end is connected to the ground potential.

One end of the parallel arm capacitor 113 is connected to a line connecting the series arm resonator 1112 and the series arm resonator 1113, and the other end is connected to the ground potential.

One end of the parallel circuit of the parallel arm resonators 114 is connected to a line connecting the series arm resonator 1113 and the series arm resonator 1114, and the other end is connected to the ground potential.

One end of the parallel arm resonator 115 is connected to a line connecting the series arm resonator 1114 and the series arm resonator 1115, and the other end is connected to the second attenuation circuit 14. In other words, the second attenuation circuit 14 is connected to the parallel arm resonator 115, which is closest to the end portion on the other side of the ladder resonance circuit 11 from the end portion connected to the inductor 12 among the plurality of parallel arm resonators that constitute the ladder resonance circuit 11. An attenuation pole adjusted by the second attenuation circuit 14 corresponds to the "second attenuation pole" according to the present disclosure.

Figure 3:
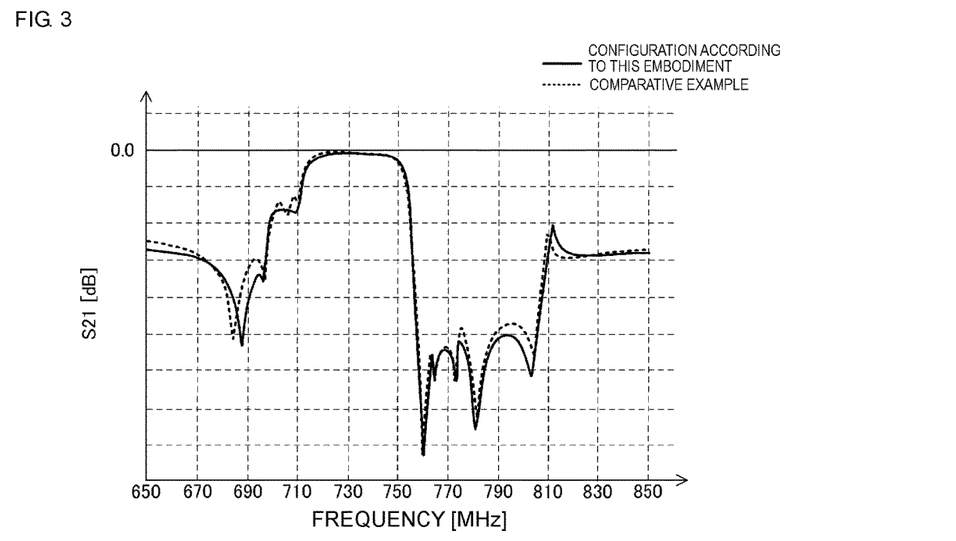
FIG. 3 is a graph depicting filter characteristics that vary depending on a position to which an attenuation pole setting circuit is connected.

Connecting the second attenuation circuit 14 to this position enables further improvement in the filter characteristic as depicted in FIG. 3 compared with connecting the second attenuation circuit 14 to the other parallel arm resonators. FIG. 3 is a graph depicting filter characteristics that vary depending on a position to which the attenuation pole setting circuit is connected. The solid line in FIG. 3 depicts a filter characteristic of a configuration (configuration according to this embodiment) in which the second attenuation circuit 14 is connected to the parallel arm resonator 115, which is closest to the end portion on the other side of the ladder resonance circuit 11 from the end portion connected to the inductor 12. The dashed line in FIG. 3 depicts a filter characteristic of a configuration (comparative example) in which the second attenuation circuit 14 is connected to a parallel arm resonator, which is the third parallel arm resonator from the end portion on the other side of the ladder resonance circuit 11 from the end portion connected to the inductor 12. As depicted in FIG. 3, by using the configuration according to this embodiment, the amount of attenuation in the frequency band on the lower-frequency side of the communication band BAND28 can be ensured, and an effect on the television broadcasting can be reduced with a higher degree of certainty.

The second attenuation circuit 14 includes a switching circuit 141 and a capacitor 142. The switching circuit 141 includes a common terminal, the first selection terminal, and the second selection terminal. The common terminal of the switching circuit 141 is connected to the parallel arm resonator 115. The first selection terminal of the switching circuit 141 is connected to one end of the capacitor 142. The other end of the capacitor 142 is connected to the ground potential. The second selection terminal of the switching circuit 141 is connected to the ground potential. The capacitance of the capacitor 142 is fixed. The second attenuation circuit 14 corresponds to the "second attenuation circuit" according to the present disclosure. The switching circuit 141 corresponds to the "second switch" according to the present disclosure. Thus, the second attenuation circuit is a variable frequency circuit that varies the resonance frequency of the parallel arm resonator 115.

By connecting the first selection terminal to the common terminal in the switching circuit 141, the parallel arm resonator 115 is connected to the ground potential via the capacitor 142. By connecting the second selection terminal to the common terminal in the switching circuit 141, the parallel arm resonator 115 is connected directly to the ground potential.

The inductor 12 is connected between the ladder resonance circuit 11 and the transmitter-side terminal Ptx. The first terminal of the inductor 12 is connected to the series arm resonator 1111 of the ladder resonance circuit 11, and the second terminal of the inductor 12 is connected to the transmitter-side terminal Ptx.

The first attenuation circuit 13 includes a switching circuit 131 and a resonator 132. An attenuation pole realized by the first attenuation circuit 13 corresponds to the "first attenuation pole" according to the present disclosure. The first attenuation circuit 13 corresponds to the "first attenuation circuit" according to the present disclosure. The switching circuit 131 corresponds to the "first switch" according to the present disclosure.

The switching circuit 131 includes a common terminal, a first selection terminal, and a second selection terminal. The common terminal of the switching circuit 131 is connected to a node (connecting node) that connects the second terminal of the inductor 12 (terminal located on the other side of the inductor 12 from the ladder resonance circuit 11) and the transmitter-side terminal P2. The first selection terminal of the switching circuit 131 is connected to one end of the resonator 132. When the first selection terminal of the switching circuit 131 is connected to one end of the resonator 132, the first attenuation circuit 13 serves as a trap circuit. The other end of the resonator 132 is connected to the ground potential. The second selection terminal of the switching circuit 131 is connected to nothing (open).

By connecting the first selection terminal to the common terminal in the switching circuit 131, the second terminal of the inductor 12 is connected to the ground potential via the resonator 132.

One end of the inductor 15 is connected to a terminal of the series arm resonator 1115 on the side of the antenna-side terminal P1, and the other end is connected to the ground potential. The inductor 15 has a function of adjusting the frequency characteristic of the variable frequency filter 10 and a function of a matching circuit.

Figure 2:
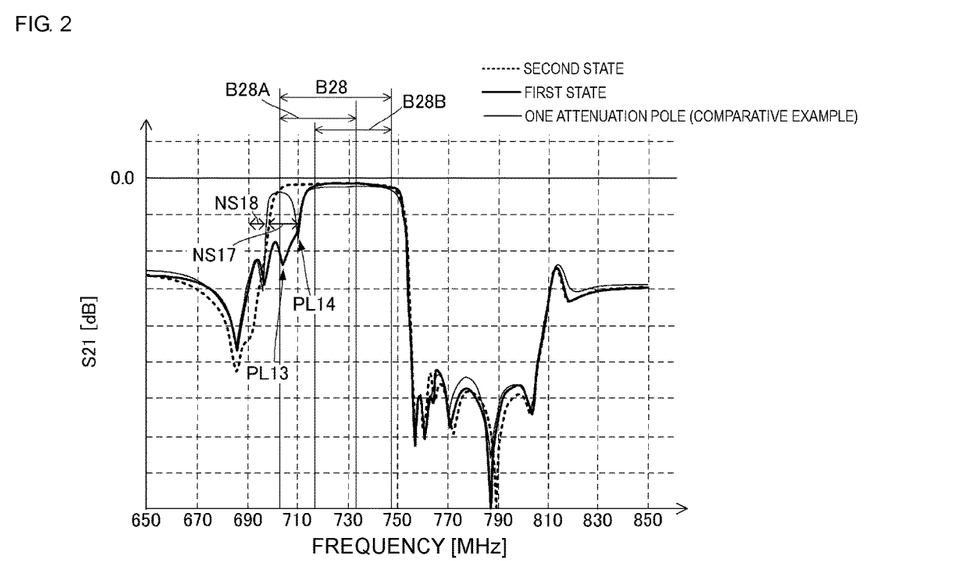
FIG. 2 is a characteristics diagram of the variable frequency filter according to the embodiment of the present disclosure.

In this configuration, the ladder resonance circuit 11, the inductors 12 and 15, the first attenuation circuit 13, and the second attenuation circuit 14 in the variable frequency filter 10 are set to have characteristics depicted in FIG. 2. FIG. 2 is a characteristics diagram of the variable frequency filter 10 according to the embodiment of the present disclosure.

In the second switching state, the common terminal is connected to the second selection terminal in the switching circuit 131. In addition, the common terminal is connected to the second selection terminal in the switching circuit 141. In this way, the parallel arm resonator 115 is connected to the ground potential without necessarily any intervening circuit element.

With this circuit configuration, the variable frequency filter 10 realizes a filter characteristic whose passband covers the entire communication frequency band of the communication band BAND28 as depicted by the dashed line in FIG. 2. In other words, the variable frequency filter 10 realizes the filter characteristic whose passband covers the entire communication frequency band of the communication band BAND28A. Specifically, this configuration is realized by extending the passband of the ladder resonance circuit 11 by the inductor 12. For example, the passband of the ladder resonance circuit 11 covers the entire communication frequency band of the communication band BAND28B and a portion of the frequency band that is in the passband of the communication band BAND28A and does not overlap the communication band BAND28B. By using the inductor 12, the passband can cover the entire communication frequency band of the communication band BAND28A, which cannot be covered by using the ladder resonance circuit 11 only, and the entire communication frequency band of the communication band BAND28B. In this way, the inductor 12 enables the passband to extend to cover a desired frequency bandwidth while the steep attenuation characteristic realized by the ladder resonance circuit 11 is maintained.

Further, the variable frequency filter 10 realizes attenuation poles on both of the lower-frequency side and the higher-frequency side of the passband. The frequencies of attenuation poles on the lower-frequency side of the communication band BAND28 are close to the threshold frequency of the passband on the lower-frequency side, leading to a large amount of attenuation at these frequencies. Thus, even if the spurious emission regulations NS18 are set on the lower-frequency side of the communication band BAND28 (BAND28A), the regulations can be satisfied.

Thus, by selecting the second switching state, communication using the communication band BAND28 or the communication band BAND28A with a low loss can be realized, and the spurious emission regulations can also be satisfied.

In the first switching state, the common terminal is connected to the first selection terminal in the switching circuit 131. In this way, the second terminal of the inductor 12 is connected to the ground potential via the resonator 132. In addition, the common terminal is connected to the first selection terminal in the switching circuit 141. In this way, the parallel arm resonator 115 is connected to the ground potential via the capacitor 142.

With this circuit configuration, the variable frequency filter 10 realizes a filter characteristic whose passband covers the entire communication frequency band of the communication band BAND28B as depicted by the thick solid line in FIG. 2. Further, the stopband of the variable frequency filter 10 covers at least a portion of the frequency band that is in the communication band BAND28A and does not overlap the communication band BAND28B, and a desired amount of attenuation can be obtained in this frequency band.

At this time, the frequency of the attenuation pole (first attenuation pole frequency) of the first attenuation circuit 13, which includes the resonator 132, is set at a frequency in the vicinity of the frequency band that is in the communication band BAND28A and does not overlap the communication band BAND28B. In this way, the amount of attenuation can be increased in the frequency band that is in the communication band BAND28A and does not overlap the communication band BAND28B, and a steep attenuation characteristic can be obtained on the lower-frequency side of the communication band BAND28B.

Further, the frequency of the attenuation pole (second attenuation pole frequency) of the ladder resonance circuit 11, the attenuation pole being adjusted by the second attenuation circuit 14, which includes the capacitor 142, is set in the frequency band that is in the communication band BAND28A and does not overlap the communication band BAND28B. In this way, a steep attenuation characteristic can be obtained on the lower-frequency side of the communication band BAND28B.

Thus, even if the spurious emission regulations NS17 are set on the lower-frequency side of the communication band BAND28B, the regulations can be satisfied.

In a circuit configuration that forms only one attenuation pole, which is a comparative example, as depicted by the thin solid line in FIG. 2, attenuation in the frequency band corresponding to the spurious emission regulations NS17 is not obtained, and the spurious emission regulations NS17 are not satisfied.

In addition, the inductor 12 shifts a resonance point of the ladder resonance circuit 11 to a frequency between the frequency band corresponding to NS17 and the frequency band corresponding to NS18, and thus the spurious emission regulations NS18 can also be satisfied as depicted by the filter characteristic represented by the dashed line in FIG. 2.

The attenuation pole determined by the capacitor 142 has a steeper slope than the slope of the attenuation pole determined by the resonator 132, which includes an inductor in an equivalent circuit. The variable frequency filter 10 sets the second attenuation pole frequency (PL14 in FIG. 2) determined by the capacitor 142 closer than the frequency of the first attenuation pole (PL13 in FIG. 2) determined by the resonator 132 to the communication frequency band of the communication band BAND28B. Consequently, the variable frequency filter 10 has a steeper attenuation characteristic on the lower-frequency side of the passband, and thus the spurious emission regulations NS17 can be satisfied with a higher degree of certainty while obtaining a low-loss bandpass characteristic in the communication band BAND28B.

In this way, whether the communication band BAND28A is selected or the communication band BAND28B, which partially overlaps the communication band BAND28A, is selected, a low-loss bandpass characteristic can be realized for each of the communication bands by using the configuration according to this embodiment, and the spurious emission regulations set for each of the stopbands can be satisfied.

Figure 4:
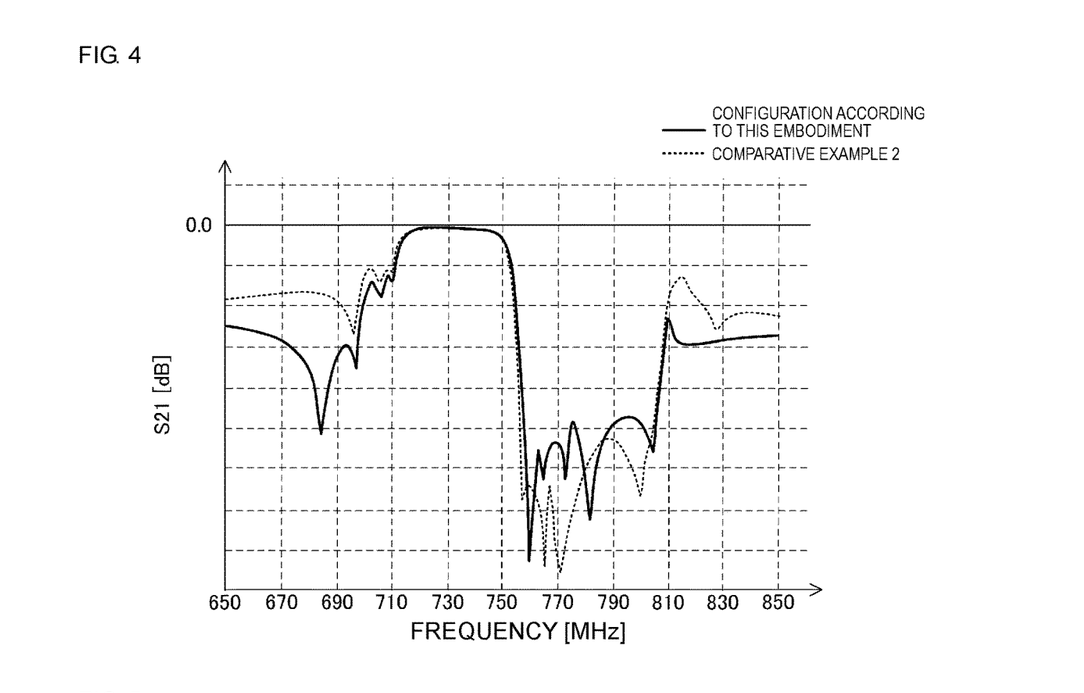
FIG. 4 is a graph depicting a comparison with a comparative filter characteristic obtained when the resonator in the first attenuation circuit connected to the transmitter-side terminal of the variable frequency filter is replaced with a capacitor.

In addition, an effect described below will also be obtained by using the configuration according to this embodiment. FIG. 4 is a graph depicting a comparison with a comparative filter characteristic obtained when the resonator in the first attenuation circuit 13 connected to the transmitter-side terminal P2 of the variable frequency filter 10 is replaced with a capacitor. The solid line in FIG. 4 represents the characteristic of the configuration according to the present disclosure, and the dashed line in FIG. 4 represents the characteristic of comparative configuration 2. Comparative configuration 2 differs in that the resonator in the first attenuation circuit 13 in the configuration according to the present disclosure is replaced with a capacitor.

As depicted in FIG. 4, using a resonator in the first attenuation circuit instead of a capacitor can make the amount of attenuation at the first attenuation pole frequency on the lower-frequency side of the passband larger than the amount of attenuation obtained by using a capacitor. In addition, the steep slope of the attenuation at the second attenuation pole frequency on the lower-frequency side of the passband can be maintained. In this way, a sufficient amount of attenuation can be obtained over the desired frequency bandwidth in the vicinity of the passband on the lower-frequency side of the passband.

The receiver-side filter circuit 20 may be a circuit known in the related art that performs selective filtering processing of the signal in the receive frequency band of the communication band BAND28A or the signal in the receive frequency band of the communication band BAND28B, or a circuit known in the related art that performs filtering processing of the signal in the receive frequency band of the communication band BAND28.

Figure 5:
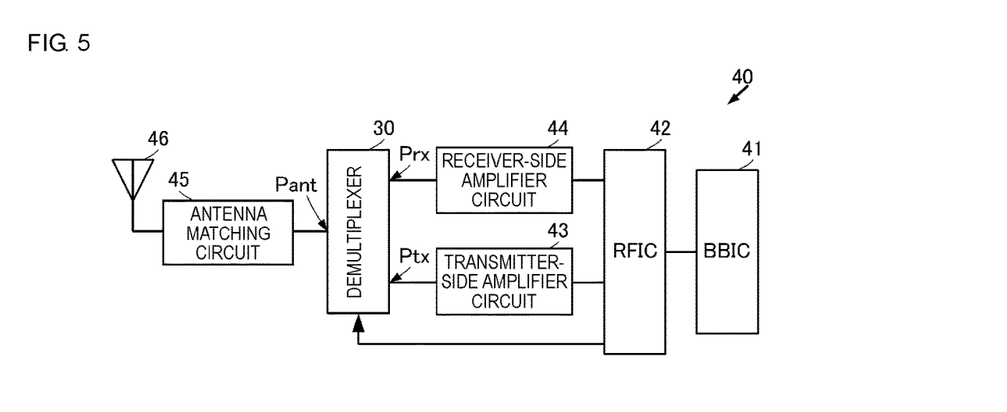
FIG. 5 is a functional block diagram of a communication terminal according to the embodiment of the present disclosure.

The demultiplexer 30 constituted this way is used for a communication terminal. FIG. 5 is a functional block diagram of a communication terminal according to the embodiment of the present disclosure.

A communication terminal 40 includes the demultiplexer 30, a baseband integrated circuit (BBIC) 41, an RFIC 42, a transmitter-side amplifier circuit 43, a receiver-side amplifier circuit 44, an antenna matching circuit 45, and an antenna 46. The antenna terminal Pant of the demultiplexer 30 is connected to the antenna 46 via the antenna matching circuit 45. The transmitter-side terminal Ptx of the demultiplexer 30 is connected to the transmitter-side amplifier circuit 43. The receiver-side terminal Prx of the demultiplexer 30 is connected to the receiver-side amplifier circuit 44. The transmitter-side amplifier circuit 43 and the receiver-side amplifier circuit 44 are connected to the RFIC 42. The RFIC 42 is connected to the BBIC 41.

The BBIC 41 performs various processing in the baseband frequency. The RFIC 42 performs radio frequency processing relating to wireless communication, specifically such as generation of a transmit signal and demodulation of a receive signal. The RFIC 42 also demodulates communication band information from the receive signal. The RFIC 42 obtains information on the communication band and the spurious emission regulations that are assigned to the communication terminal 40 from the communication band information. The RFIC 42 generates a transmit signal in the frequency band of the assigned communication band. The RFIC 42 outputs a switching control signal to the variable frequency filter 10 in the demultiplexer 30 in accordance with the assigned communication band. The variable frequency filter 10 performs switching control of the switching circuit 131 of the first attenuation circuit 13 and the switching circuit 141 of the second attenuation circuit 14 in accordance with the switching control signal.

The transmit signal that is output from the RFIC 42 is amplified by the transmitter-side amplifier circuit 43. The transmitter-side amplifier circuit 43 includes a power amplifier (PA) and the like and amplifies the transmit signal. The amplified transmit signal is input to the transmitter-side terminal Ptx of the demultiplexer 30. The transmit signal is subjected to filtering processing in the variable frequency filter 10, which is a transmitter-side filter circuit, and is output from the antenna terminal Pant. The transmit signal is transmitted to the antenna 46 via the antenna matching circuit 45 and is transmitted to outside from the antenna 46. At this time, whether the assigned communication band is the communication band BAND28A or the communication band BAND28B, in accordance with the assigned communication band, the variable frequency filter 10 having the configuration described above can transmit the transmit signal with a low loss and attenuate with certainty unnecessary wave such as harmonics generated in the transmitter-side amplifier circuit 43. In this way, no unnecessary radio frequency signal is transmitted to outside in a communication band other than the assigned communication band, and thus the spurious emission regulations can be satisfied.

The receive signal received by the antenna 46 is input to the antenna matching circuit 45 and then to the antenna terminal Pant of the demultiplexer 30. The receiver-side filter circuit 20 of the demultiplexer 30 performs filtering processing of the receive signal and outputs the receive signal from the receiver-side terminal Prx. The receive signal is input to the receiver-side amplifier circuit 44. The receiver-side amplifier circuit 44 includes a low noise amplifier (LNA) and the like and outputs the receive signal to the RFIC 42 after amplification.

Figure 6:
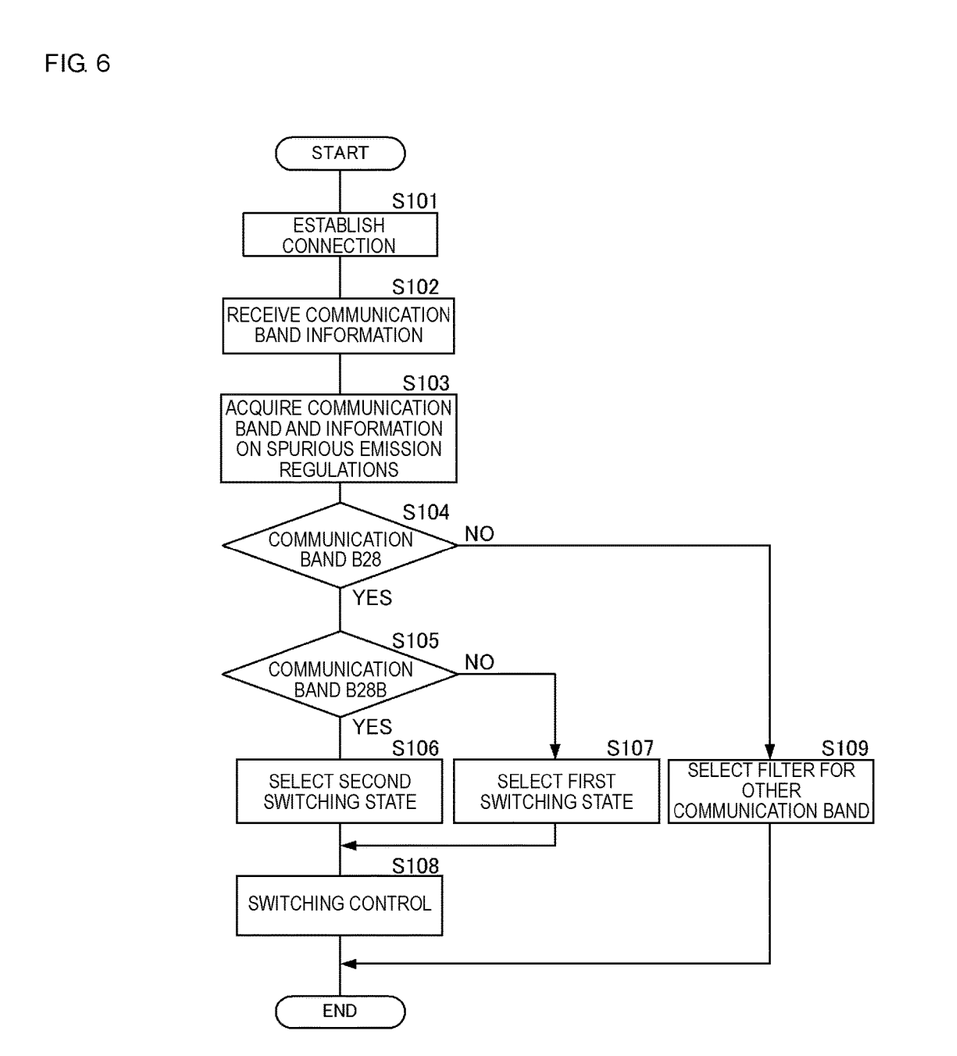
FIG. 6 is a flowchart of a method of setting the variable frequency filter according to the embodiment of the present disclosure.

The communication terminal 40 described above performs setting of the variable frequency filter 10 following the system flow depicted in FIG. 6. FIG. 6 is a flowchart of a method of setting the variable frequency filter according to the embodiment of the present disclosure.

First, the communication terminal 40 establishes a connection to a base station as a connection establishing process (S101). The communication terminal 40 transmits terminal identifying information including the identifier (ID) of the communication terminal 40 at predetermined intervals. The terminal identifying information may include the position of the terminal. The base station acquires the ID of the communication terminal 40 from the terminal identifying information and establishes a connection to the communication terminal 40 if the communication terminal 40 is one of the communication terminals allowed to communicate with the base station.

Once the connection is established, the communication terminal 40 receives communication band information from the base station as a receiving process (S102). The communication band information includes a communication band (assigned communication band) that the communication terminal 40 is allowed to use. The communication band information also includes information on spurious emission regulations relating to the assigned communication band.

The communication terminal 40 demodulates the communication band information as an information acquiring process and acquires the assigned communication band and information on the spurious emission regulations (S103). The information on the spurious emission regulations may be acquired in advance and stored.

The communication terminal 40 performs switching control as a setting process so as to transmit the communication signal in the assigned communication band with a low loss and to satisfy the spurious emission regulations. Specifically, if the assigned communication band is the communication band BAND28B (YES in S104 and YES in S105), the communication terminal 40 selects the first switching state (S106). If the assigned communication band is the communication band BAND28A (YES in S104 and NO in S105), the communication terminal 40 selects the second switching state (S107). The communication terminal 40 performs switching control of the switching circuit 131 of the first attenuation circuit 13 and the switching circuit 141 of the second attenuation circuit 14 in accordance with the switching mode (S108). In this way, the communication terminal 40 realizes a filter characteristic that is capable of low-loss transmission in the communication band BAND28B and that satisfies the spurious emission regulations NS17 and NS18 on the lower-frequency side of the communication band BAND28B. The communication terminal 40 also realizes a filter characteristic that is capable of low-loss transmission in the communication band BAND28A and that satisfies the spurious emission regulations NS18 on the lower-frequency side of the communication band BAND28A.

If the assigned communication band is not the communication band BAND28 (NO in S104), the communication terminal 40 selects a filter suitable for the assigned communication band (S109).

The variable frequency filter is properly set in accordance with the communication band information by performing the processes described above, and proper filtering processing is realized.

In the above description, the communication band BAND28A in the communication band BAND28 is assumed to be the first communication band, and the communication band BAND28B is assumed to be the second communication band by way of example. However, the configuration according to the present disclosure can be applied to other communication bands whose communication frequency bands overlap with each other.

The first attenuation circuit 13 may be connected to the line connecting the ladder resonance circuit 11 to the inductor 12. However, connecting the first attenuation circuit 13 to a terminal on the other side of the inductor 12 from the ladder resonance circuit 11 can realize the design of the extension effect by using the inductor 12 and the design of the attenuation pole frequency by using the first attenuation circuit 13 more accurately and more easily.

Figure 7:
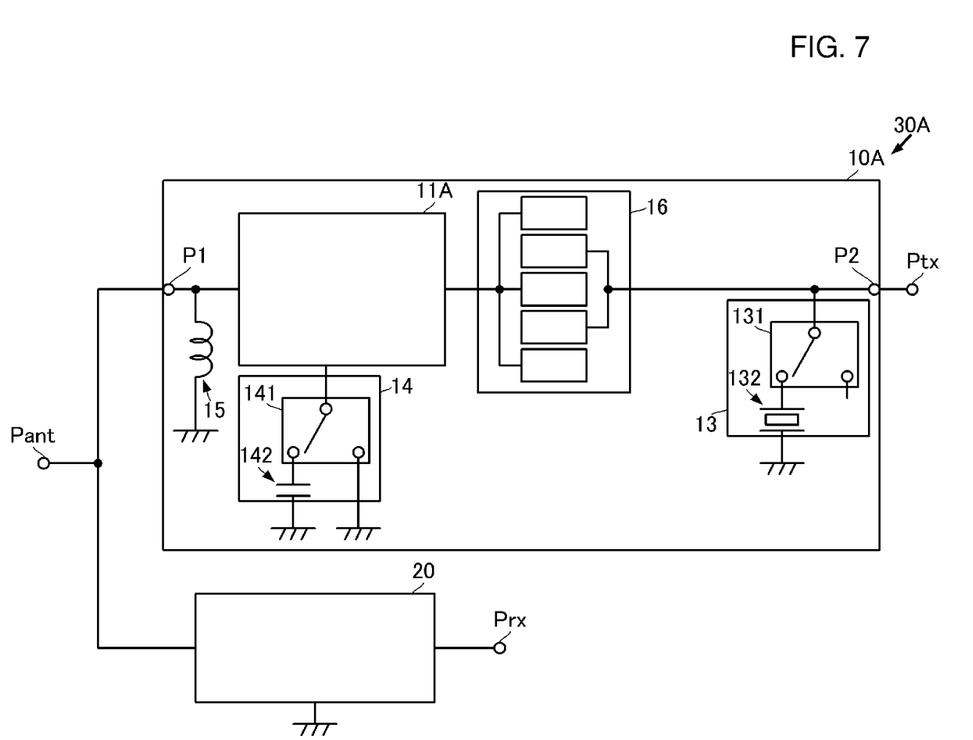
FIG. 7 is a circuit diagram of a radio frequency filter including a longitudinally coupled resonance circuit.

In the above description, a mode in which a ladder resonance circuit is used as the variable frequency filter is discussed. However, a combination of a ladder resonance circuit and a longitudinally coupled resonance circuit (longitudinally coupled resonator filter) may constitute a variable frequency filter. FIG. 7 is a circuit diagram of a radio frequency filter including a longitudinally coupled resonance circuit. A demultiplexer 30A includes a variable frequency filter 10A, which is a transmitter-side filter circuit. The variable frequency filter 10A differs from the variable frequency filter 10 described above in that the inductor 12 is removed and a series circuit of a ladder resonance circuit 11A and a longitudinally coupled resonance circuit 16 having a plurality of resonators is used instead of the ladder resonance circuit 11.

Such a configuration can also realize a filter characteristic similar to the filter characteristic of the variable frequency filter 10 in FIG. 1, and operations and effects similar to those realized by the variable frequency filter 10 can be obtained.

In the related art, a plurality of fixed frequency filters may be selectively used in a configuration for the communication bands to which the variable frequency filter according to the present disclosure is applied. This is because it is easier to use a fixed frequency filter for realizing a filter characteristic suitable for each of the communication bands in a case where a plurality of communication bands to be selected have passbands that are closely aligned or partially overlap with each other.

However, miniaturization is not easy for a configuration in which a plurality of fixed frequency filters are installed and switched when in use because the number of constituent elements increases.

In contrast, the configuration according to the present disclosure can realize filter characteristics suitable for a plurality of communication bands by using a single variable frequency filter, leading to miniaturization.

REFERENCE SIGNS LIST 10, 10A variable frequency filter
10P1, 10P2 TX filter 11, 11A ladder resonance circuit
12, 15 inductor
13 first attenuation circuit
14 second attenuation circuit
16 longitudinally coupled resonance circuit
20 receiver-side filter circuit
20P1, 20P2 RX filter
30, 30A demultiplexer
30P1, 30P2 duplexer
40 communication terminal
41 BBIC
42 RFIC
43 transmitter-side amplifier circuit
44 receiver-side amplifier circuit
45 antenna matching circuit
46 antenna
50P front-end circuit
51P1, 51P2, 51P3 switching circuit
112, 114, 115 parallel arm resonator
113 parallel arm capacitor
131, 141 switching circuit
132 resonator
142 capacitor
1111, 1112, 1113, 1114, 1115 series arm resonator
Pant antenna terminal
Prx receiver-side terminal
Ptx transmitter-side terminal

The invention claimed is:

1. A variable frequency filter comprising:
a ladder resonance circuit comprising a series arm circuit connected between an antenna-side terminal and a transmitter-side terminal, and a parallel arm circuit connected between a first node on the series arm circuit and ground, wherein the parallel arm circuit comprises a first parallel arm resonator;
a first attenuation circuit connected between ground and a second node between the ladder resonance circuit and the transmitter-side terminal; and
a second attenuation circuit connected in series between the first parallel arm resonator and ground,
wherein the first attenuation circuit comprises:
a second parallel arm resonator, and
a first switch configured to selectively switch between a first state in which the second parallel arm resonator is connected to the second node, and a second state in which the first switch is open,
wherein the second attenuation circuit comprises:
a capacitor, and
a second switch configured to selectively switch between a first state in which the capacitor is connected to the first parallel arm resonator, and a second state in which the first parallel arm resonator is connected to ground, and
wherein the second switch is in the first state when the first switch is in the first state.

2. The variable frequency filter according to claim 1, wherein the second switch is in the second state when the first switch is in the second state.

3. The variable frequency filter according to claim 1, wherein the ladder circuit further comprises a second parallel arm circuit connected between the series arm circuit and ground, the second parallel arm circuit comprising at least one parallel arm resonator.

4. The variable frequency filter according to claim 1, wherein:
the second parallel arm resonator forms a first attenuation pole,
the first parallel arm resonator and the capacitor together form a second attenuation pole, and
a frequency of the second attenuation pole is closer to a communication frequency band of the variable frequency filter when the first switch and the second switch are in the first states than a frequency of the first attenuation pole.

5. The variable frequency filter according to claim 1, further comprising:
an inductor connected between the second node and the ladder resonance circuit.

6. The variable frequency filter according to claim 5, wherein the inductor is connected in series with the ladder resonance circuit.

7. The variable frequency filter according to claim 5, wherein the inductor is configured to extend a resonance frequency of the ladder resonance circuit such that a passband of the variable frequency filter includes communication frequency bands of signals passing through the variable frequency filter when the first switch and second switch are in the first state and in the second state.

8. The variable frequency filter according to claim 5, wherein a passband of the variable frequency filter comprises a frequency between a frequency band of spurious emission regulations NS17 and a frequency band of spurious emission regulations NS18.

9. The variable frequency filter according to claim 1, further comprising a longitudinally coupled resonator filter connected in series between the series arm circuit and the second node.

10. An RF front-end circuit comprising:
the variable frequency filter according to claim 1, the variable frequency filter being implemented as a transmitter-side filter configured to filter a transmission signal in a communication band; and
a transmitter-side amplifier circuit connected to the variable frequency filter.

11. The RF front-end circuit according to claim 10, further comprising:
a receiver-side filter configured to filter a receive signal in the communication band,
wherein the variable frequency filter and the receiver-side filter constitute a demultiplexer.

12. A communication terminal comprising:
the RF front-end circuit according to claim 11;
a receiver-side amplifier circuit connected to the receiver-side filter; and
a radio frequency integrated circuit (RFIC) connected to the transmitter-side amplifier circuit and the receiver-side amplifier circuit.

13. The communication terminal according to claim 12, wherein the RFIC is configured to control the selective switching of the first switch of the first attenuation circuit and of the second switch of the second attenuation circuit based on the communication band.

* * * * *